(12) United States Patent
Bever et al.

(10) Patent No.: US 6,278,167 B1
(45) Date of Patent: Aug. 21, 2001

(54) SEMICONDUCTOR SENSOR WITH A BASE ELEMENT AND AT LEAST ONE DEFORMATION ELEMENT

(75) Inventors: Thomas Bever, München; Stephan Schmitt, Kaufering; Günter Ehrler, Holzkirchen, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/531,203

(22) Filed: Mar. 20, 2000

Related U.S. Application Data

(63) Continuation of application No. PCT/DE98/02356, filed on Aug. 14, 1998.

(51) Int. Cl.[7] .................................................. H01L 29/82
(52) U.S. Cl. .......................... 257/415; 257/417; 257/419; 257/420; 257/254
(58) Field of Search ................................. 257/415, 417, 257/419, 420, 254

(56) References Cited

U.S. PATENT DOCUMENTS

| Re. 34,893 | * | 4/1995 | Fujii et al. .......................... 257/419 |
| 4,125,820 | * | 11/1978 | Marshall ................................... 338/4 |
| 4,885,621 | | 12/1989 | Yoder et al. . |
| 4,891,984 | | 1/1990 | Fujii et al. . |
| 5,178,016 | * | 1/1993 | Dauenhauer et al. ................. 73/727 |
| 5,231,301 | * | 7/1993 | Peterson et al. ..................... 257/419 |
| 5,296,730 | * | 3/1994 | Takano et al. ....................... 257/417 |
| 5,549,006 | | 8/1996 | Kurtz . |
| 5,591,679 | | 1/1997 | Jakobsen et al. . |
| 5,629,538 | | 5/1997 | Lipphardt et al. . |
| 5,632,854 | | 5/1997 | Mirza et al. . |
| 5,949,118 | * | 9/1999 | Sakai et al. .......................... 257/419 |

FOREIGN PATENT DOCUMENTS

| 37 43 080 A1 | 7/1988 | (DE) . |
| 0 672 899 A2 | 9/1995 | (EP) . |
| 7335213 | 4/1974 | (FR) . |
| 60-83379 | * 5/1985 | (JP) ..................................... 257/419 |
| 4-357882 | * 6/1991 | (JP) ..................................... 257/419 |

OTHER PUBLICATIONS

International Publication No. WO 96/19719 (McHale et al.), dated Jun. 27, 1996.

* cited by examiner

*Primary Examiner*—Eddie C. Lee
*Assistant Examiner*—Matthew E. Warren
(74) *Attorney, Agent, or Firm*—Herbert L. Lerner; Laurence A. Greenberg; Werner H. Stemer

(57) ABSTRACT

The invention relates to a semiconductor sensor having a base element (4) and at least one deformation element (8). The deformation element (8) is composed of a semiconductor substrate that is doped with a dopant of a first conductivity type. Piezoresistors (14) that are doped with a dopant of the opposite conductivity type are located in the deformation element (8). The deformation element (8) has at least one part that is in contact with a medium. The semiconductor sensor is characterized in that the part has a lower concentration of the dopant than a further region located between it and the piezoresistor (14).

9 Claims, 3 Drawing Sheets

SEMICONDUCTOR SENSOR WITH A BASE ELEMENT AND AT LEAST ONE DEFORMATION ELEMENT

CROSS-REFERENCE TO RELATED APPLICATION

This is a continuation of copending International Application PCT/DE98/02356, filed Aug. 14, 1998, which designated the United States.

BACKGROUND OF THE INVENTION

1. Field of the Invention

The invention relates, in general, to a semiconductor sensor having a base element and at least one deformation element composed of a semiconductor substrate that is doped with a dopant of a first conductivity type. In particular, at least one piezoresistor, doped with a dopant of an opposite conductivity type from the first conductivity type, is located in the deformation element, and the deformation element is in contact with a medium in at least one part of its surface.

A semiconductor sensor is a sensor that can be fabricated using process steps that are known from microelectronics. As a result of the fabrication with process steps that are known from microelectronics it is possible to connect a semiconductor sensor of the generic type to an electronic circuit, or to integrate it into such a circuit. The known semiconductor sensors of the generic type are designed as piezoresistive pressure sensors for absolute, relative, and differential pressure measurements. In order to obtain a high degree of sensitivity, the deformation element, for example a silicon diaphragm, must have the greatest possible extent (edge length or radius) and the greatest possible thickness.

Because of the large superficial extent of the deformation element, the consumption of material and the effort to manufacture it are large. This applies in particular in the case of semiconductor sensors for measuring small pressures or pressure differentials or small changes in acceleration.

2. Summary of the Invention

It is accordingly an object of the invention to provide a generic semiconductor sensor with a deformation element which overcomes the hereinafore-mentioned disadvantages of the heretofore-known devices of this general type in such a way that the deformation element has the smallest possible superficial dimensions and has the highest possible degree of sensitivity.

This object is achieved in that a semiconductor sensor of the generic type is designed in such a way that a part of its surface has a lower concentration of a dopant than a further region that is located between it and the piezoresistor.

The invention therefore provides for a semiconductor sensor to be produced in which the concentration of the dopant varies between the piezoresistive resistor track and a free surface of the deformation element.

With the foregoing and other objects in view there is provided, in accordance with the invention, a semiconductor sensor that includes a base element and a deformation element made from a semiconductor substrate that is doped with a dopant of a first conductivity type. The deformation element includes at least one part that is in contact with a medium and that has a concentration of the dopant of the first conductivity type. The deformation element is disposed on the base element. At least one piezoresistor is located in the deformation element. The piezoresistor is doped with a dopant of a second conductivity type that is opposite to that of the first conductivity type. The deformation element includes a region having a concentration of a dopant and which is located between the part and the piezoresistor. The part has a concentration of a dopant that is lower than the concentration of the dopant of the region.

The free surface of the deformation element can be in contact with any desired medium. The medium may be either gaseous, liquid, or solid. It makes it possible to deform the deformation element or it acts on the deformation element in such a way that it deforms. This medium may be, for example, one whose properties are to be detected, such as is the case with a pressure sensor. It is equally possible for the medium merely to have the function of permitting the deformation element to be deflected, such as in the case of an acceleration sensor. In both cases, the free surface of the deformation element has a lower concentration of the dopant than at least one region lying between it and the piezoresistor, which is, for example, a piezoresistive resistor track.

The semiconductor sensor according to the invention has a high dielectric strength, which means that the electrical breakdown voltage is increased. Because of the relatively high dielectric strength, a relatively high current can flow through the piezoresistor. The relatively high off-state voltage which is formed in such a case does not lead to an electrical breakdown because of the relatively high dielectric strength. At the same time, the extent of the deformation element can be reduced during its fabrication using an etching method, because an effective etch stop is provided.

It is particularly expedient to design the semiconductor sensor in such a way that the deformation element is of planar design. It is also advantageous if the part of the surface and the further region are formed by layers which extend parallel to the main plane of the deformation element.

Such a semiconductor sensor is characterized by its ease of fabrication. Therefore, while the layers are being grown on epitaxially, it is possible to vary the dopant content between the layers lying one on top of the other by varying the dopant content in the supplied gas atmosphere.

If the exposed part of the surface is bounded by a surface region which adjoins a base element, the concentration gradient between the deformation element and the base element adjoining it is particularly high. During the fabrication of unsupported regions of the deformation element by means of an etching process, for example, an electrochemical deep etching process, this concentration gradient gives rise to an optimum etch stop. One or more upper layers are doped more highly in order to delimit the electrical field between them and the piezoresistive track or tracks.

In accordance with an added feature of the invention, there is provided an embodiment of the semiconductor sensor that is particularly easy to fabricate in which the deformation element has two layers. The first layer forms the part of the surface, the second layer forms the further region, and the second layer adjoins the piezoresistive resistor track.

In accordance with an additional feature of the invention, there is provided a semiconductor sensor in which the thickness of the deformation element is reduced further. It is characterized in that the deformation element has three layers, the first layer forming the part of the surface, the second layer adjoining the piezoresistive resistor track, and the further region being formed by a third layer located between the first and the second layer.

In order to provide a deformation element having the smallest possible thickness and with the highest possible dielectric strength, it is advantageous for the concentration of the dopant in the region with the highest concentration to be higher than in the region with the lowest concentration by at least a factor of 10.

In order to obtain a deformation element having the smallest possible thickness, the thickness of the region with the highest concentration is less than 10 μm.

The semiconductor sensor may be designed as a pressure sensor, which is expediently effected by connecting the deformation element in its edge region to the base element.

In this case, the deformation element is preferably designed as a thin diaphragm. The deformation element can be in the shape of a circular plate, a circular ring-shaped plate with a flexurally rigid center, a rectangular plate, or a rectangular plate with a flexurally rigid center. Each of these plate geometries has specific associated mechanical stress characteristics. The piezoresistive resistor tracks are expediently configured in the regions where a particularly high mechanical structure occurs. As a result, even a small deflection of the pressure sensor gives rise to a detectable electrical voltage.

The semiconductor sensors according to the invention can, however, also form acceleration sensors. This is effected particularly expediently by virtue of the fact that certain sections of the deformation element are in contact with a wall of the base element and a seismic mass is configured on the opposite side of the deformation element. The deformation element is thus only connected to the base element by certain sections. On at least one further section, a seismic mass is connected to the deformation element.

The functional principle of the acceleration sensor is based on the fact that a force which is converted into an electrical signal by means of the sensor mechanism is generated by accelerations acting on a sensor mass from the outside. In this piezoresistive acceleration sensor, the mechanical stress is converted into a change in the resistivity because of the piezoresistive effect. In further deformation regions, the change in resistance is proportional to the acceleration. While an enclosed, thin diaphragm is formed by the deep etching process in the case of a pressure sensor, for this micromechanical acceleration sensor the etching process is carried out in such a way that the deformation element is in the shape of a web.

It is particularly expedient if the exposed surfaces of this web have a low dopant concentration. In this case, the piezoresistive resistors are provided with at least one envelope made of a material with a higher dopant concentration, while the outer surfaces of the web have a lower dopant concentration.

Other features which are considered as characteristic for the invention are set forth in the appended claims.

Although the invention is illustrated and described herein as embodied in a semiconductor sensor with a base element and at least one deformation element, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
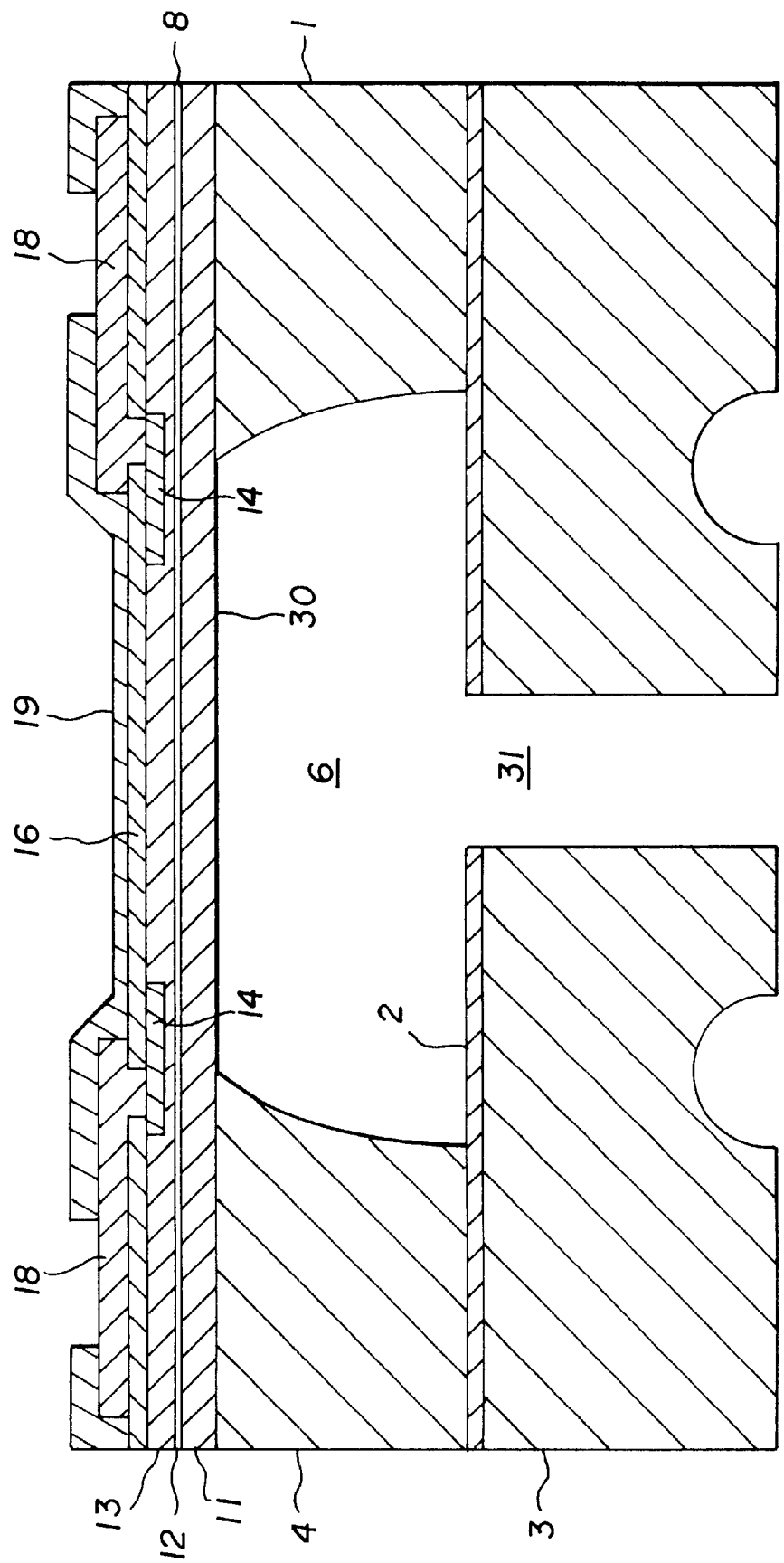
FIG. 1 shows a cross section through a pressure sensor according to the invention.

Referring now to the figures of the drawing in detail, and first particularly, to FIG. 1 thereof, there is seen a pressure sensor 1, which is in particular, a low pressure sensor. It is connected to a carrier chip 3 by means of a gold connection layer 2. The base element 4 of the pressure sensor 1 is formed from monocrystalline silicon by means of a substrate which is doped with a dopant of the n-type. The concentration of the dopant in the base element is approximately $5 \times 10^{17}$ cm$^{-3}$, preferably $3 \times 10^{18}$ cm$^{-3}$.

The base element 4 has a large recess 6 which has been formed, for example, by selectively etching-away the substrate forming the base element 4.

On the base element 4 there is the deformation element 8 which is formed by three layers 11, 12, and 13 that are grown epitaxially on the base element 4.

The first epitaxial layer or bottom layer 11 is a monocrystalline silicon layer that was doped with a dopant of the n-type using phosphorus atoms with a concentration of $3 \times 10^{14}$ cm$^{-3}$. The thickness of the bottom layer 11 is 3 μm.

Above the first epitaxial layer 11 there is a further 2 μm thick, epitaxially grown-on layer 12 made of monocrystalline silicon which has a dopant concentration of $3 \times 10^{15}$ cm$^{-3}$.

The upper layer 13, which is also composed of epitaxially grown-on silicon, is 4 μm thick and has an n-type dopant concentration of $3 \times 10^{14}$ cm$^{-3}$.

In the upper layer 13 there are piezoresistors 14 which are doped with dopants of the p-type with a concentration of at least $1 \times 10^{17}$ cm$^{-3}$, preferably with a concentration of $3 \times 10^{18}$ cm$^{-3}$. By virtue of the fact that an off-state voltage is formed between the piezoresistors 14 and the upper layer 13, current only flows through the piezoresistors 14.

A first covering layer 16 is applied above the upper layer 13. The first covering layer 16 is interrupted in certain sections in order to permit the piezoresistors 14 to be connected to conductor tracks 18. The conductor tracks 18 serve to connect the piezoresistors 14 to external contacts (not illustrated). There is a further covering layer 19 on the first covering layer 16 and on the parts of the conductor tracks 18 which are to be protected.

The deformation element 8 includes at least one part 30 for contacting a medium 31.

Such a pressure sensor can be fabricated as follows:

The bottom layer 11 is applied to the base element 4 by means of a CVD (Chemical Vapor Deposition) method, i.e. by means of chemical gas phase deposition. For this purpose, first a reaction gas composed of chlorosilane ($SiCl_2H_2$) is conveyed to the surface of the base element. A multistage surface reaction, comprising the adsorption of the starting material, the chemical reaction $SiCl_2H_2 \rightarrow Si + 2HCl$ and the surface diffusion of the solid reaction product silicon in monocrystalline form, takes place at the surface. The gaseous reaction product HCl is then de-absorbed or released. The de-absorbed, gaseous reaction product HCl is then transported away.

The bottom layer 11 which is generated by means of the CVD method and is which composed of monocrystalline silicon has the same crystallographic orientation as the base element 4 on which it was deposited. The crystal structure of the base element 4 is continued during the growth of layers. Since the base element 4 is formed by a solid, monocrystalline substrate, the bottom layer 11 is an epitaxial layer. The epitaxy of the silicon layers is carried out at reaction temperatures of between 1000 and 1280° C. in the CVD system.

By adding a phosphorus-containing gas to the reaction gas, the desired dopant concentration of $3 \times 10^{18}$ cm$^{-3}$ is achieved.

The epitaxial growth of the middle layer 12 is a continuation of the growth of the lower layer 11. By increasing the content of a phosphorus-containing gas in the reaction gas of the CVD process, the desired dopant concentration of $3 \times 10^{15}$ cm$^{-3}$ is achieved.

The upper layer 13 which is also grown on epitaxially is given a dopant concentration of $3 \times 10^{14}$ cm$^{-3}$ by correspondingly adding phosphorus to the reaction gas.

In the upper layer 13, the piezoresistors 14 are produced as piezoresistive resistor tracks by selective ion implantation of dopants of the p-type. The piezoresistors 14 have a concentration of the dopant of the p-type of at least $1 \times 10^{17}$ cm$^{-3}$, preferably of $3 \times 10^{18}$ cm$^{-3}$.

The first covering layer 16 is then applied and structured by means of a photolithographic method. The conductor tracks 18 are subsequently applied and structured. Finally the upper or further covering layer 19 is applied to the conductor tracks 18 and to the first covering layer 16 and then is also structured.

The rear of the pressure sensor 1 is then processed. The essential process step here is a selective etching process by means of which the base element 4 is etched away in the vicinity of the recess 6 as far as the lower layer 11. In order to obtain an effective etch stop, a high concentration gradient of the dopant is necessary between the base element 4 and the lower layer 11. With the abovementioned concentrations of the dopants, this concentration gradient is found in the boundary region between the base element 4 and the lower layer 11.

The semiconductor sensor which is fabricated in this way can then be mounted on a carrier chip 3. For this purpose, first a gold connection layer 2 is vapor-deposited onto the carrier chip 3. The gold connection layer 2 permits the pressure sensor 1 to be permanently and durably connected to the carrier chip 3.

Figure 2:
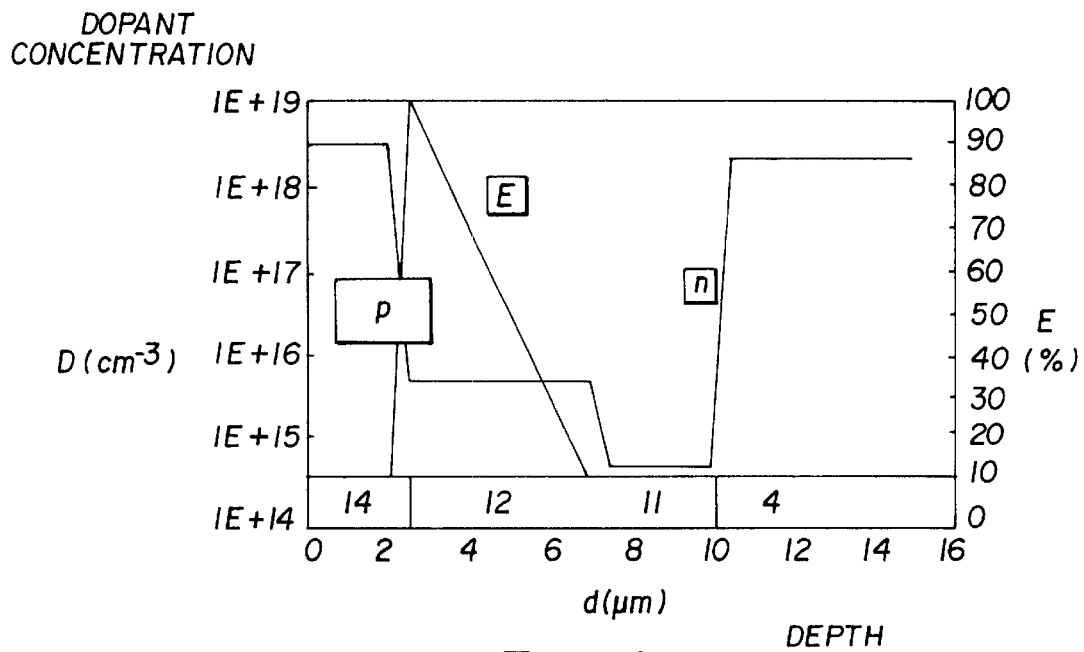
FIG. 2 shows the dependence of the doping on the depth in the case of two epitaxial layers.

In FIG. 2, the dopant concentration D (cm-3) is applied for two epitaxially grown-on layers as a function of the depth d ($\mu$m). The piezoresistor 14 has a dopant concentration of the p-type of $3 \times 10^{18}$ cm$^{-3}$. Underneath the piezoresistor 14 there is a layer 12 which is doped with dopants of the n-type with a concentration of $3 \times 10^{15}$ cm$^{-3}$. The lower layer 11 lying below is doped with dopants of the n-type with a concentration of $3 \times 10^{14}$ cm$^{-3}$. The base element 4, to which the layers 11 and 12 are applied, has a dopant concentration of the n-type of $3 \times 10^{18}$ cm$^{-3}$.

Figure 3:
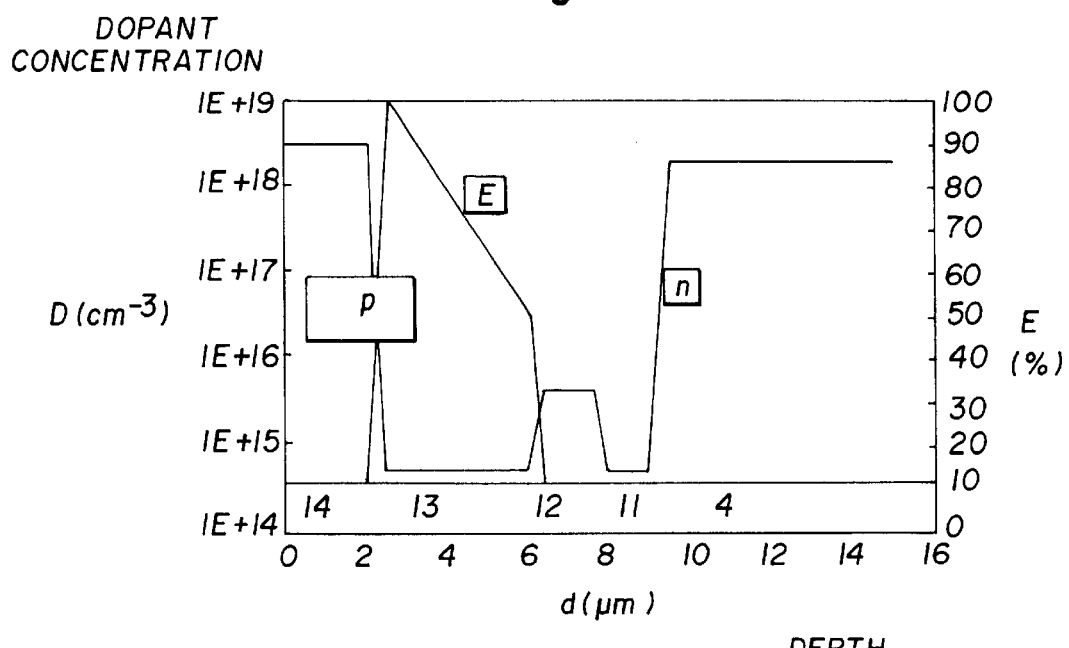
FIG. 3 shows the dependence of the doping on the depth in the case of three epitaxial layers.

The dependence of the dopant concentration D (cm$^{-3}$) which is illustrated in FIG. 3 with three epitaxially grown-on layers as a function of the depth d ($\mu$m) corresponds to the values occurring with the pressure sensor 1 shown in FIG. 1.

Here too, the piezoresistor 14 has a dopant concentration of the p-type of $3 \times 10^{18}$ cm$^{-3}$. Underneath the piezoresistor 14 there is a layer 13 which is doped with dopants of the n-type with a concentration of $3 \times 10^{14}$ cm$^{-3}$. Underneath the layer 13 there is the layer 12 which is doped with dopants of the n-type with a concentration of $3 \times 10^{15}$ cm$^{-3}$. The layer 11 lying below is doped with dopants of the n-type with a concentration of $3 \times 10^{14}$ cm$^{-3}$. The base element 4, to which the layers 11, 12 and 13 are applied, has a dopant concentration of the n-type of $3 \times 10^{18}$ cm$^{-3}$.

In the exemplary embodiments illustrated, the base element 4 and the layers (11–13) located on it are doped with dopants of the n-type, while the piezoresistors 14 are doped with dopants of the p-type. However, it is equally possible for the base element 4 and the layers (11–13) to be doped with dopants of the p-type while the piezoresistors 14 are doped with dopants of the n-type.

It is also possible for layers (11–13) which are doped with dopants of the n-type to be applied to a base element 4 which is doped with dopants of the p-type. The concentration gradient of the dopants which is necessary between the base element 4 and the lower layer 11 in order to bring about an etch stop when processing the rear side of the pressure sensor 1 is ensured if a layer with a low dopant concentration, either with n-type doping or p-type doping, follows a base element 4 which is highly doped with dopants of the n-type. A layer 11 which has a low dopant concentration, either of the n-type or of the p-type, can also follow a base element 4 which has a high dopant concentration with dopants of the p-type.

The exemplary embodiments illustrated relate to the embodiment of the semiconductor sensor according to the invention as a pressure sensor 1.

However it is also possible to use a semiconductor sensor according to the invention as a converter which converts a mechanical effect into an electrical signal. An example of this is an acceleration sensor in which an acceleration is transformed into a change in resistance.

Figure 4:
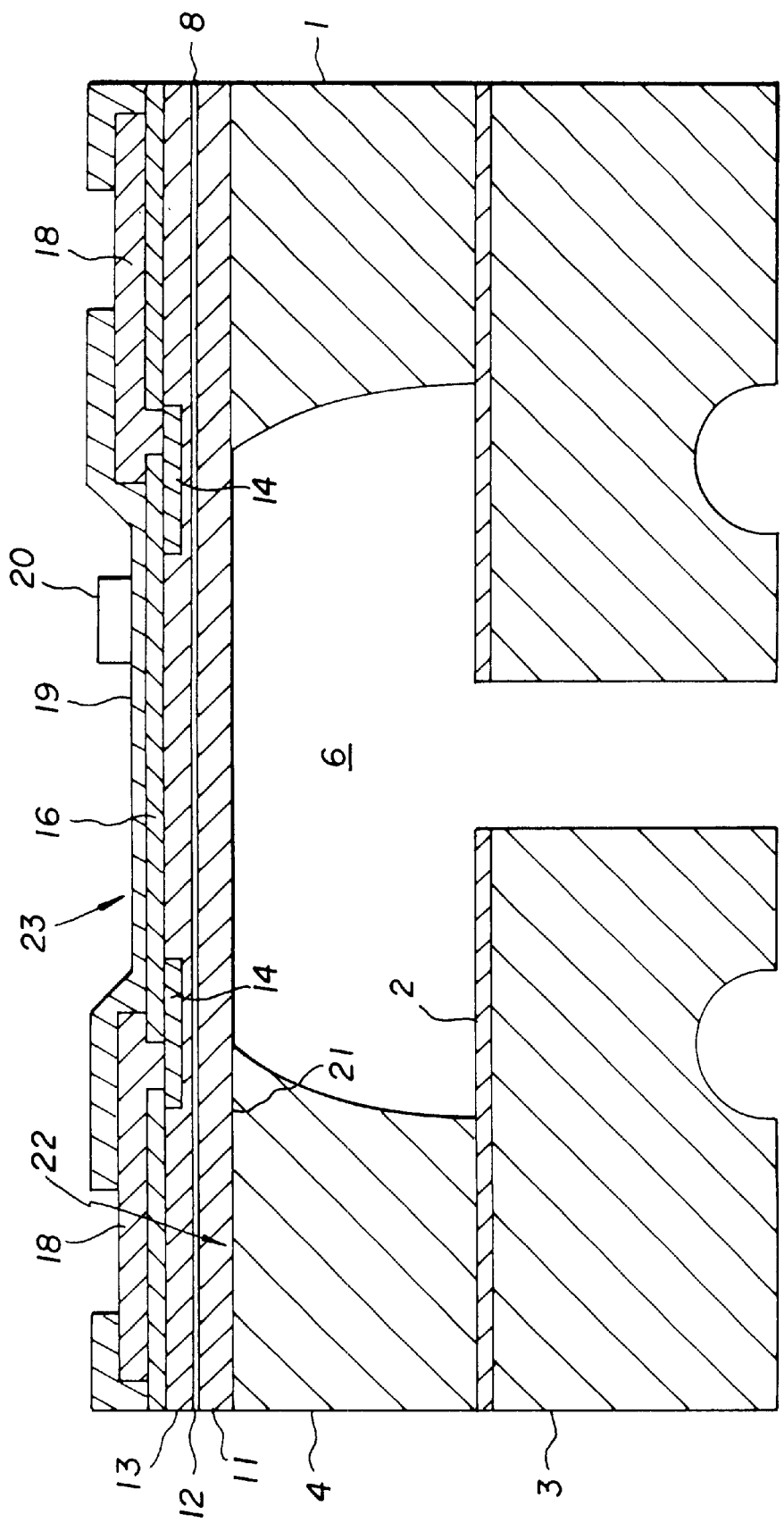
FIG. 4 shows a semiconductor sensor in the form of an acceleration sensor.

FIG. 4 shows an embodiment of a semiconductor sensor in the form of an acceleration sensor 1'. This is effected particularly expediently by virtue of the fact that certain sections 22 of the deformation element 8 are in contact with a wall 21 of the base element 4 and a seismic mass 20 is configured on the opposite side 23 of the deformation element 8. The deformation element 8 is thus only connected to the base element 4 by certain sections 22.

A semiconductor sensor according to the invention may also, for example, be designed as a moisture sensor. For this purpose, the seismic mass present at the acceleration sensor is replaced by a body with a large surface. The body here is designed in such a way that it can easily absorb molecules of fluid.

We claim:

1. A semiconductor sensor, comprising:

a base element;

a deformation element made from a semiconductor substrate that is doped with a dopant of a first conductivity type, said deformation element including at least one part for contacting a medium, said part having a concentration of the dopant of the first conductivity type, said deformation element disposed on said base element; and at least one piezoresistor doped with a dopant of a second conductivity type that is opposite that of the first conductivity type, said piezoresistor located in said deformation element;

said deformation element including a region having a concentration of a dopant and located between said part and said piezoresistor, said part having a concentration of a dopant that is lower than the concentration of the dopant of said region.

2. The semiconductor sensor according to claim 1, wherein said deformation element has a planar design.

3. The semiconductor sensor according to claim 1, wherein said deformation element defines a main plane and said part and said region are formed by layers that extend parallel to the main plane of said deformation element.

4. The semiconductor sensor according to claim 1, wherein said deformation layer has a first layer that forms said part and has a second layer that forms said region, said second layer adjoining said piezoresistor.

5. The semiconductor sensor according to claim 1, wherein said deformation layer includes:

a first layer that forms said part;

a second layer adjoining said piezoresistor; and a third layer forming said region, said third layer located between said first layer and said second layer.

6. The semiconductor sensor according to claim 1, wherein a concentration of dopant in a region with the highest dopant concentration is higher than a concentration of dopant in a region with the lowest dopant concentration by at least a factor of 10.

7. The semiconductor sensor according to claim 1, wherein a region with the highest dopant concentration has thickness that is less than 10 $\mu$m.

8. The semiconductor sensor according to claim 1, wherein said deformation element has an edge region that is connected to said base element.

9. The semiconductor sensor according to claim 1, comprising:

a seismic mass, said deformation element having a side with said seismic mass configured thereon and said deformation element having sections opposite said side;

said base element having a wall contacting said sections of said deformation element.

* * * * *